(12) United States Patent
Yamaji

(10) Patent No.: US 6,223,327 B1
(45) Date of Patent: Apr. 24, 2001

(54) CELL HIERARCHY VERIFICATION METHOD AND APPARATUS FOR LSI LAYOUT

(75) Inventor: Masafumi Yamaji, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/134,937

(22) Filed: Aug. 17, 1998

(30) Foreign Application Priority Data

Aug. 15, 1997 (JP) .................................................. 9-220419

(51) Int. Cl.[7] ...................................................... G06F 17/50
(52) U.S. Cl. ................................................................ 716/5
(58) Field of Search ................................. 716/18; 438/14

(56) References Cited

U.S. PATENT DOCUMENTS 5,727,187 * 3/1998 Lemche .................................. 716/18
6,057,169 * 5/2000 Singh ..................................... 438/14

* cited by examiner

Primary Examiner—Matthew Smith
Assistant Examiner—Thuan Do
(74) Attorney, Agent, or Firm—Sughrue, Mion, Zinn, Macpeak & Seas, PLLC

(57) ABSTRACT

In order to improve verification performance for the cell hierarchy in a gate array LSI layout, and accurately, efficiently verify the hierarchy at a high speed, this invention relates to a hierarchy verification method and apparatus for an LSI layout in which, in verifying the cell hierarchy in the gate array LSI layout, input gate array LSI layout data is divided into a top cell data portion and a function block cell data portion, the top cell data portion is mapped while leaving only a wiring figure in an underlying cell, an underlying cell of the function block cell data portion that is pasted while maintaining a relative positional relationship with a laid function block cell is mapped, and each figure layout of the cell hierarchy is verified using the obtained top cell data and function block cell data.

7 Claims, 22 Drawing Sheets

CELL HIERARCHY VERIFICATION METHOD AND APPARATUS FOR LSI LAYOUT

BACKGROUND OF THE INVENTION

1. Field of the Invention

The present invention relates to a cell hierarchy verification method and apparatus for an LSI layout and, more particularly, to a cell hierarchy verification method and apparatus for verifying and correcting the hierarchical layout of cell figures forming a gate array LSI layout.

2. Description of the Prior Art

Technical terms used in the description of the present invention will be first explained.

"LSI layout" is a cluster of one or more cells which are hierarchically described.

Figures in the cells of the LSI layout are classified into "diffusion figures" and "polysilicon figures" forming transistors and "wiring figures" connecting the transistors. These figures can be discriminated from each other by integral numbers called layer numbers.

"Cell" represents a processing unit consisting of one or a plurality of necessary figures. Each unit cell has "origin" independent of other cells, and "name" for discriminating the cell from other cells. The discrimination name added to each cell is particularly called "cell name".

"Cell references figure" means that enough information to represent attributes in a cell such as a figure shape, layout position, and layer number is stored in a predetermined format using the cell origin as a reference.

"Hierarchically described" means that the references of cells are sequentially described using one reference cell as a top. A reference cell serving as a top is particularly called "top cell". A referencing cell is called "parent cell", and a referenced cell is called "child cell". A last-stage cell, which can be reached by sequentially traversing child cells from a specific cell, e.g, a first-stage cell (parent cell), is called "descendant cell of first-stage cell".

Each layout figure pattern (to be simply referred to as a figure hereinafter) forming a transistor will be described.

FIG. 7 is a perspective view schematically showing a conventional LSI layout in which figures forming a transistor in the manufacturing process are vertically separated. In FIG. 7, reference numeral 101 denotes a polysilicon figure; and 102, a diffusion figure. The polysilicon and diffusion FIGS. 101 and 102 are laid out so as to divide the diffusion FIG. 102 into two, right and left regions by the polysilicon FIG. 101.

FIG. 8A is a perspective explanatory view three-dimensionally schematically showing the structure of a transistor manufactured based on an LSI layout using the figure layout in FIG. 7. FIG. 8B shows symbols set in advance in order to represent the circuit arrangement. In FIG. 8A, the transistor is roughly comprised of a polysilicon wiring layer 111, a gate 112, and a pair of diffusion regions 113 and 114.

The polysilicon wiring layer 111 is formed in correspondence with the polysilicon FIG. 101, and the gate 112 is formed in correspondence with the portion where the polysilicon and diffusion FIGS. 101 and 102 overlap each other. The diffusion regions 113 and 114 are formed in the remaining portions in the diffusion FIG. 102 that are divided by the overlapping portion with the polysilicon FIG. 101.

As is well known, the gate 112, and a portion 115 between the diffusion regions 113 and 114 are subjected to predetermined processing in order to electrically connect the diffusion regions 113 and 114 upon current supply to the polysilicon wiring layer 111.

That is, these portions 111 to 114 construct one objective transistor.

The schematic arrangement of a cell hierarchy verification apparatus for a conventional LSI layout will be described with reference to FIGS. 1 to 13.

FIG. 1 is a block diagram showing the schematic arrangement of a conventional cell hierarchy verification apparatus. In FIG. 1, the conventional apparatus comprises an input data section 1a having each input data registered in advance in a memory unit such as a hard disk, an input device 2 such as a keyboard or a mouse for instructing apparatus operation, a data processor 3a which operates under program control, a memory section 4a such as a memory on a computer, an output data section 5a for outputting verification data to a memory unit such as a hard disk, and a verification section 6a for verifying LSI layouts using verification data and appropriately outputting the verification results.

The input data section 1a includes each individual data such as a top cell name 11, a function block cell name 12, and LSI layout data 13. The data processor 3a comprises an input unit 31 for reading necessary data from the input data section 1a in correspondence with an operation instruction from the input device 2, a mapping unit 35 for mapping data for each function block cell, and an output unit 34 for outputting a mapped LSI layout.

The memory section 4a comprises a general-purpose memory unit 41 for temporarily storing each data read by the input unit 31, and a cell memory unit 46 used for cell mapping.

The output data section 5a includes LSI layout verification data 53 output upon mapping. The verification section 6a comprises an appropriate verification means 62 for verifying hierarchy on the basis of the LSI layout verification data 53, and outputs corrected verification result data and the like.

The operations of the respective building sections in the conventional apparatus will be described.

Upon reception of an instruction from the input device 2, the input unit 31 of the data processor 3a sequentially loads corresponding data from the input data section 1a, and temporarily stores them in the general-purpose memory unit 41 of the memory section 4a. The mapping unit 35 checks whether a cell to be processed is present for all cells each having a top cell name or a function block cell name stored in the general-purpose memory unit 41, and maps cells to be processed one by one in accordance with an operation flow shown in FIG. 2 (step D1). Mapping in step D1 for the cells to be processed is performed in accordance with an operation flow shown in FIG. 3.

Referring to FIG. 3, in step E1, cell data are loaded from the general-purpose memory unit 41 and temporarily stored in the cell memory unit 46. In step E2, as shown in FIG. 4, the cell data in the cell memory unit 46 are sequentially read out from the first one. Processing of "if the readout data is figure data, sending it to the output unit 34, erasing it from the cell memory unit 46, and reading out the next data" is repeatedly performed until all the stored data are processed.

If the readout data is cell reference information in step E2, whether the cell name is a function block cell name stored in the general-purpose memory unit 41 is checked in step E3. If NO in step E3, corresponding cell data is loaded via the input unit 31. In step E4, the coordinate values of the data are transformed into coordinates on the parent cell, and the resultant data is additionally stored at the final address in the cell memory unit 46. If YES in step E3, the reference information is directly sent to the output unit 34 without retrieving the cell contents.

The output unit 34 receives the respective LSI layout data from top cell data in units of function block cell data. The output unit 34 outputs the data to the output data section 5a. The output data section 5a sequentially stores the mapped data as LSI layout verification data 53 in a memory unit such as a hard disk. The LSI layout verification data 53 are sent to the verification section 6a and appropriately verified by the verification means 62. As a result, data substantially corrected by the verification results are output.

The operation of the conventional apparatus will be explained using detailed input data.

FIG. 5 is an explanatory view showing an example of the cell hierarchical structure of input data in the conventional apparatus. In this example, a top cell name corresponds to bold-line cell A, and function block cell names correspond to bold-line cells B, E, and F. In the cell hierarchical structure in FIG. 5, top cell name A and function block cell names B, E, and F are designated via the input device 2 in accordance with LSI layout file names as input data.

Input data loaded to the input unit 31 of the data processor 3a are temporarily stored in the general-purpose memory unit 41 and mapped in order from cells A, B, E, and F (step D1). In step D1, during processing for top cell A, figures forming the cell are sequentially mapped by the mapping unit 35, and the mapped figures are sent to the output unit 34 (step E2). When data processing in step E2 progresses to reference information of cell C as a child cell for top cell A, it is determined in step E3 that cell C is not a function block cell. The processing therefore advances to step E4, and the figure data of cell C is coordinate-transformed into figure data of cell A as a parent cell. Similarly, reference information of cell F within cell C is temporarily transformed into coordinate values on cell A. The resultant data are registered in the cell memory unit 46.

When processing in the loop of step E2 progresses to reference information of function block cell B and reference information of function block cell F, it is determined in step E3 that cells B and F are "function block cells". The pieces of reference information are directly sent to the output unit 34. In this manner, in processing for top cell A, cell C is erased, while function block cells B and F are left.

Similarly, in mapping for function block cell B, cell D is mapped, and function block cell E is left. In mapping for function block cell E, both cells G and H are mapped. Data of function block cell F are directly output because there is no reference cell.

The output unit 34 outputs each received data as one data file. By referring to the LSI layout verification data 53 output from the output unit 34, a cell hierarchical structure comprised of cells A, B, E, and F can be obtained, as shown in FIG. 6.

A gate array LSI layout based on an LSI layout having the above transistor arrangement will be explained.

FIG. 9 is an explanatory view showing the features of the gate array LSI layout. Referring to FIG. 9, the cell hierarchy of the gate array LSI layout can be divided into an underlying cell portion 121 and an overlying cell portion 122 at the boundary of a given hierarchical layer. The underlying and overlying cells 121 and 122 have no parent-child relationship.

As shown in FIG. 10, the underlying cell 121 references cells including the polysilicon Figures 101 and the diffusion Figures 102 forming transistors, and cells including wiring Figures 103 for supplying power to transistors using a predetermined array representation.

As is apparent from FIG. 10, "array representation" is a representation method in which the data amount is effectively reduced by representing figures or cells as "xn figures or cells in the x direction at an interval w, and ym figures or cells in the y direction at an interval h".

For example, when n x m figures or cells are to be laid out in the x and y directions, if no array representation is employed, information corresponding to

[information on one figure or cell] x n x m is inevitably required. However, if data are stored using an array representation, any increase in number of figures or cells to be laid out requires only four kinds of requirements, i.e., the interval w and the number xn in the x direction and the interval h and the number ym in the y direction. As a result, information can be reduced to

[information on one figure or cell] 4

In this case, figures forming transistors and figures for supplying power are not referenced one by one by an array representation. Instead, as shown in the gate array LSI layout in FIG. 10, a set of figures forming one or a plurality of transistors are described on one cell, and this cell is referenced by an array representation. Power supply wiring figures are described in a cell describing transistors, or defined in another cell and referenced by an array representation.

As shown in FIG. 11, cells 132 called function blocks are laid out to overlap the layout of cells 131 including transistor figures referenced by an array representation. In each function block cell 132, the polysilicon and diffusion Figures 101 and 102 for transistors, and wiring Figures 103 for connecting power supply wiring layers to each other and/or transistors to power supply wiring layers are described, as shown in FIG. 12. As upper cells, wiring Figures 133 for connecting the function block cells 132 are similarly described, as shown in FIG. 13.

However, the cell hierarchy verification apparatus for a conventional gate array LSI layout having the above arrangement suffers the following problems.

First, in the conventional gate array LSI layout, it is impossible to map all cells from a top cell and verify the layout.

This is because an underlying cell is compressed and referenced by an array representation in order to reduce the data size in a memory unit such as a hard disk, and all array representations must be mapped to verify the layout, which requires a larger memory capacity of the memory unit used in the program, resulting in a verification failure.

Second, the conventional gate array LSI layout cannot be verified by hierarchical processing for each cell at the boundary of a function block cell.

This is because the function block cell includes only wiring figures for connecting transistors to each other, and a connection error between a wiring figure and an underlying cell which are automatically laid out cannot be verified by verification for each function block cell.

SUMMARY OF THE INVENTION

The present invention has been made to solve the conventional drawbacks, and has as its object to provide a cell hierarchy verification method and apparatus for an LSI layout which can improve verification performance for cell hierarchy in a gate array LSI layout, and accurately, efficiently verify the hierarchy at a high speed.

Generally, in verifying the cell hierarchy of a gate array LSI layout, when the cell hierarchy is divided into a top cell portion and a function block cell portion at the boundary of a function block cell, and each figure data is mapped, the figure of the top cell portion may contact the figure of the function block cell portion at a wiring figure portion for supplying power to an underlying cell as a descendant cell of the top cell, a wiring figure portion for connecting function block cells, and a wiring figure portion for connecting transistors within a function block cell. In view of this, the present invention has the following aspects in order to achieve the object.

More specifically, according to the first aspect of the present invention, there is provided a cell hierarchy verification method for an LSI layout in which each figure data forming a gate array LSI layout is input and mapped, and cell hierarchy of the LSI layout is verified using output data of a mapping result, comprising: outputting top cell data mapped while leaving only a wiring figure in an underlying cell, from a data portion for mapping a top cell of each input figure data; outputting function block cell data including a mapped underlying cell pasted while maintaining a relative positional relationship with a laid function block cell, from a data portion for mapping a function block cell of each input figure data; and verifying the cell hierarchy using the output data.

The cell hierarchy verification method for an LSI layout is provided.

According to the second aspect of the present invention, there is provided a cell hierarchy verification method for an LSI layout, wherein a top cell data portion of each input figure data and a function block cell data portion of each input figure data are separately mapped by first mapping means and second mapping means.

According to the third aspect of the present invention, there is provided a cell hierarchy verification method for an LSI layout, wherein each input figure data in the verification method defined in the first or second aspect includes gate array LSI layout data, a wiring layer number, an underlying cell name, and an overlying cell name, and a top cell data portion and a function block cell data portion of the figure data are mapped.

According to the fourth aspect of the present invention, there is provided a cell hierarchy verification apparatus for an LSI layout in which each figure data forming a gate array LSI layout is mapped, and cell hierarchy of the LSI layout is verified using output data of a mapping result, comprising at least: first mapping means for mapping a top cell data portion of each input figure data while leaving only a wiring figure in an underlying cell, and outputting top cell data; and second mapping means for mapping an underlying cell of a function block cell data portion that is pasted while maintaining a relative positional relationship with a laid function block cell, and outputting function block cell data, wherein the cell hierarchy is verified using the output data.

According to the fifth aspect of the present invention, there is provided a cell hierarchy verification apparatus for an LSI layout, wherein each input figure data in the apparatus defined in the fourth aspect includes gate array LSI layout data, a wiring layer number, an underlying cell name, and an overlying cell name, and a top cell data portion and a function block cell data portion of the figure data are separately mapped by the first mapping means and the second mapping means.

As is apparent from the above aspects, according to the cell hierarchy verification method and apparatus for an LSI layout according to the present invention, in verifying cell hierarchy in a gate array LSI layout, input gate array LSI layout data is divided into a top cell data portion and a function block cell data portion. The top cell data portion is mapped while leaving only a wiring figure in an underlying cell. The function block cell data portion is processed to map an underlying cell pasted while maintaining a relative positional relationship with a laid function block cell. The obtained top cell data and function block cell data are output for verification. Therefore, at the top cell portion, a figure layout for each cell in which connection between the wiring layers of a top cell and a function block cell is accurately recognized can be appropriately, speedily verified without mapping figures forming transistors. At the function block, a layout including figures forming transistors can be verified. In addition, the capacity of a memory unit used for mapping can be decreased.

The above and many other objects, features and advantages of the present invention will become manifest to those skilled in the art upon making reference to the following detailed description and accompanying drawings in which preferred embodiments incorporating the principles of the present invention are shown by way of illustrative example.

DETAILED DESCRIPTION OF PREFERRED EMBODIMENTS

A preferred embodiment of a cell hierarchy verification method and apparatus for an LSI layout according to the present invention will be described in detail below with reference to FIGS. 14 to 23C.

Figure 1:
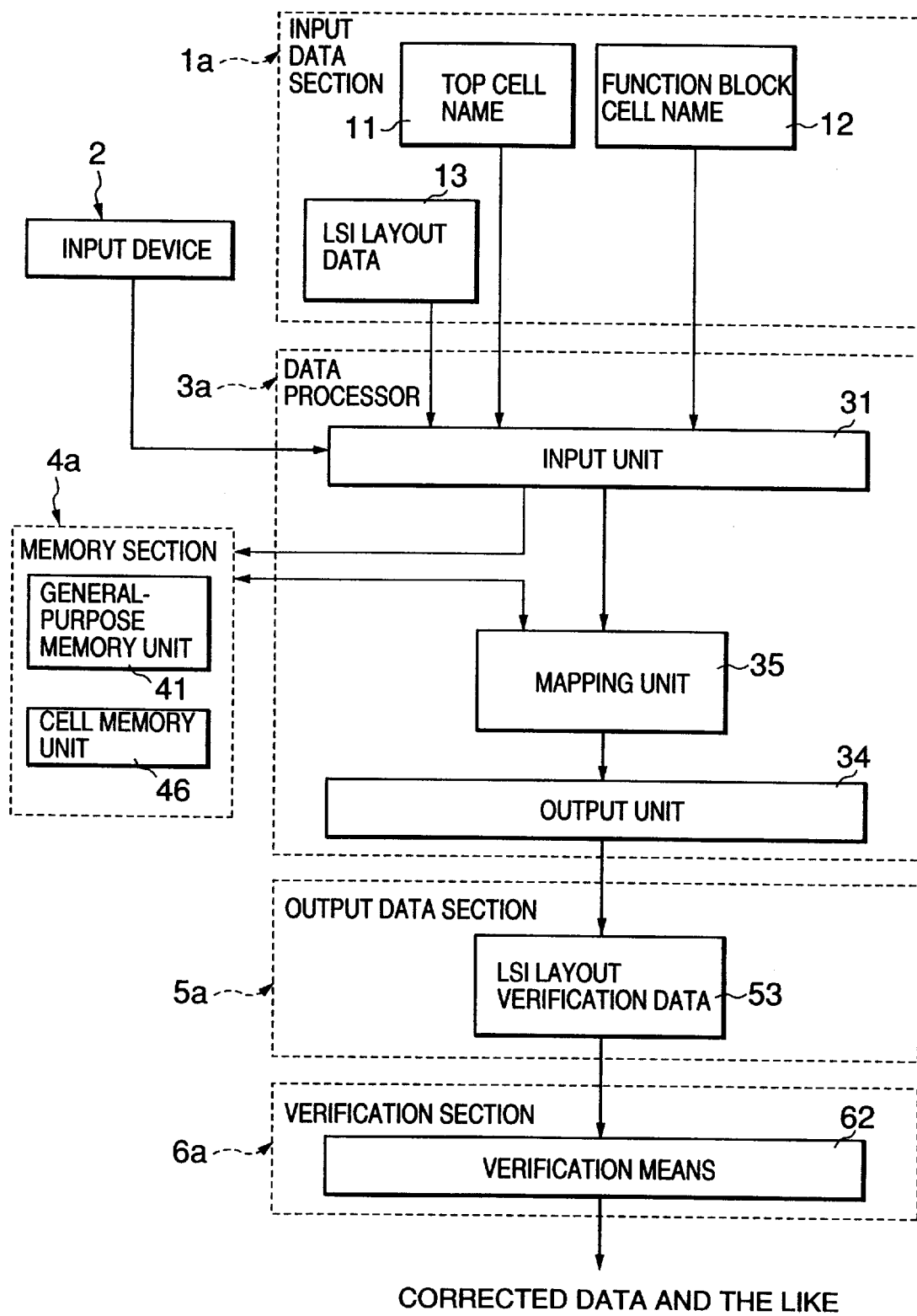
FIG. 1 is a block diagram showing the schematic arrangement of a conventional cell hierarchy verification apparatus.
Figure 2:
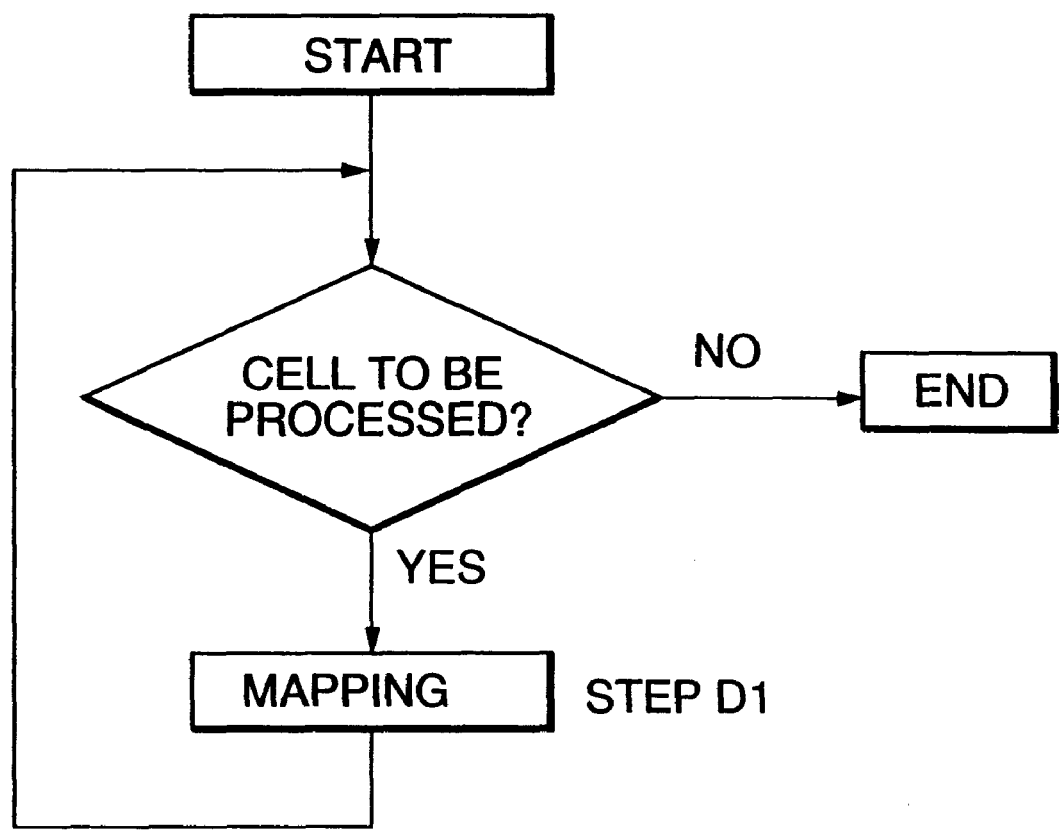
FIG. 2 is a flow chart for explaining the operation in the mapping unit in FIG. 1.
Figure 3:
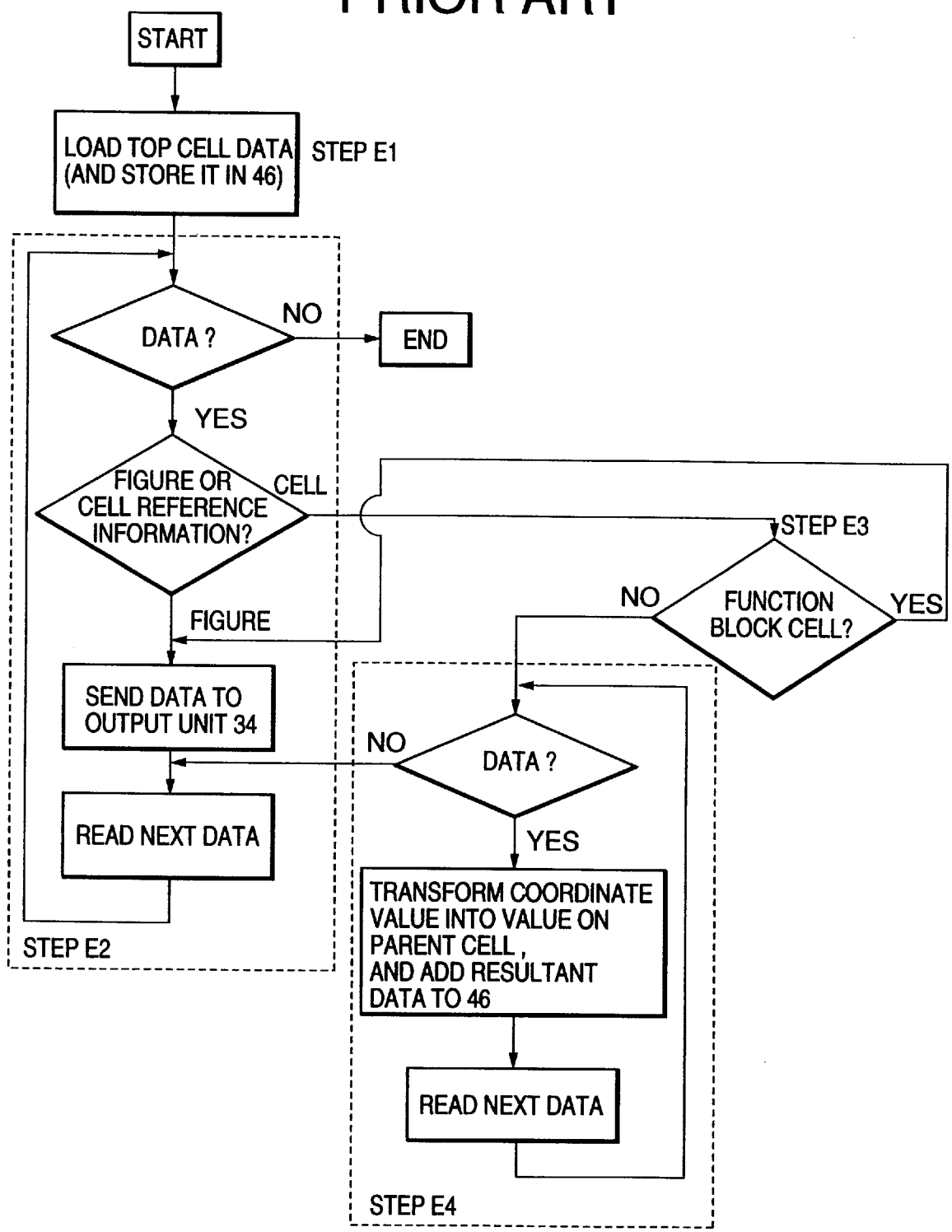
FIG. 3 is a flow chart showing the detailed operation of the mapping unit in FIG. 2.
Figure 4:
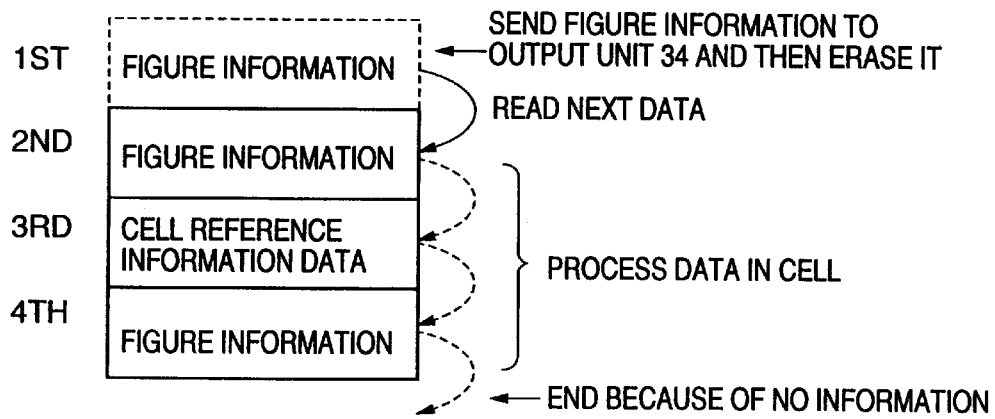
FIG. 4 is a view for explaining the operation in step E2 of FIG. 3.
Figure 5:
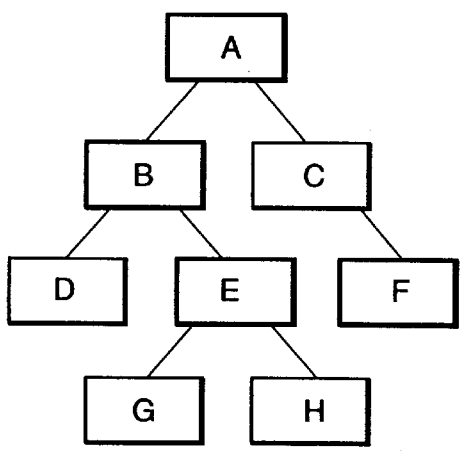
FIG. 5 is a view showing the cell hierarchical structure of input data.
Figure 6:
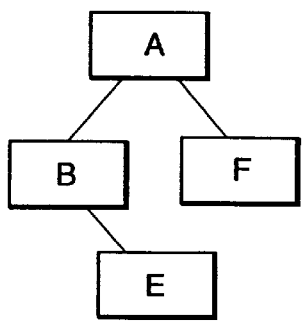
FIG. 6 is a view showing the cell hierarchical structure of output data.
Figure 7:
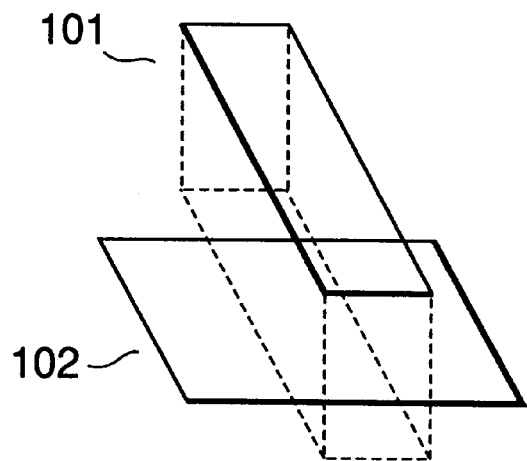
FIG. 7 is a perspective view schematically showing a conventional LSI layout in which figures forming a transistor in the manufacturing process are vertically separated.
Figure 8A:
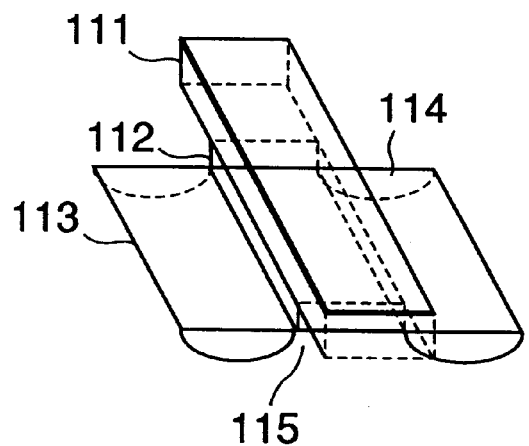
FIG. 8A is a perspective explanatory view three-dimensionally schematically showing the structure of a transistor manufactured based on an LSI layout using the figure layout in FIG. 7.
Figure 8B:
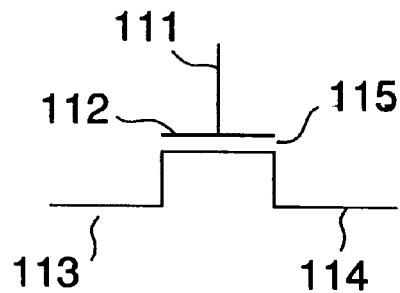
FIG. 8B is a diagram showing symbols set in advance in order to represent the circuit arrangement of the transistor.
Figure 9:
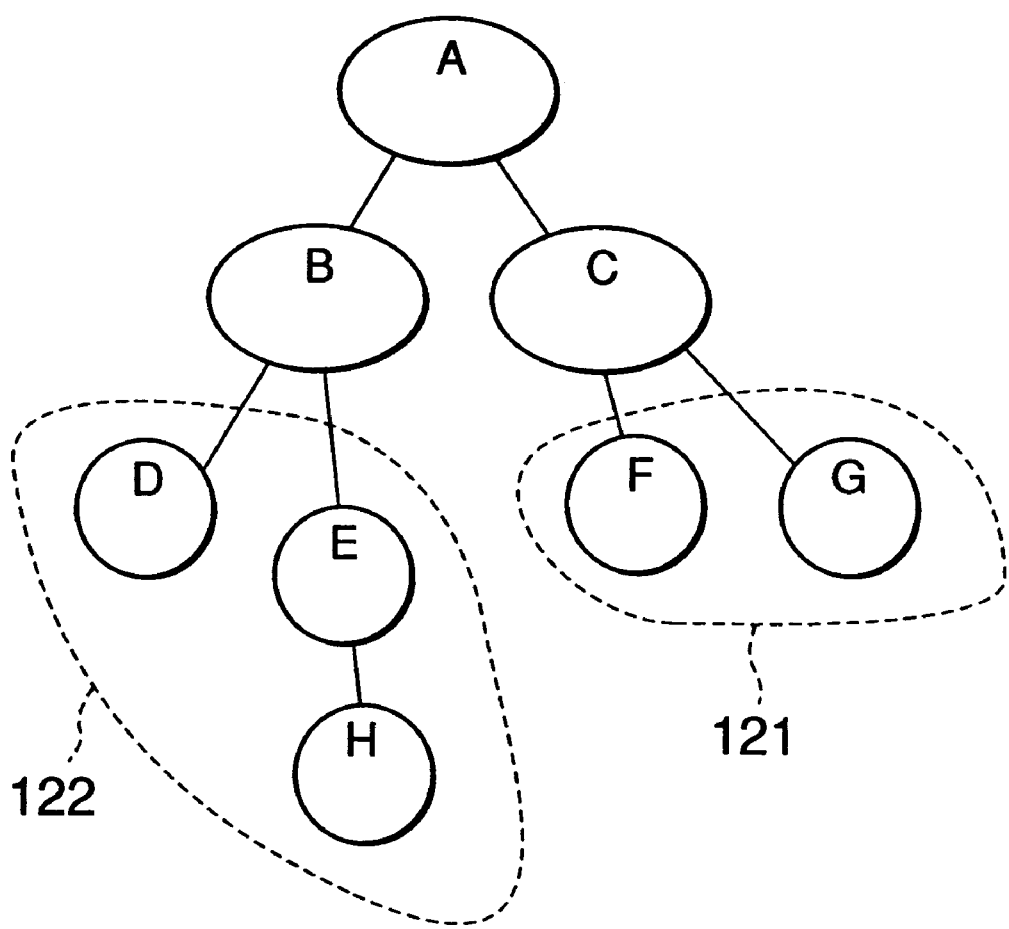
FIG. 9 is an explanatory view for explaining the features of a cell hierarchical structure in a gate array LSI layout.
Figure 10:
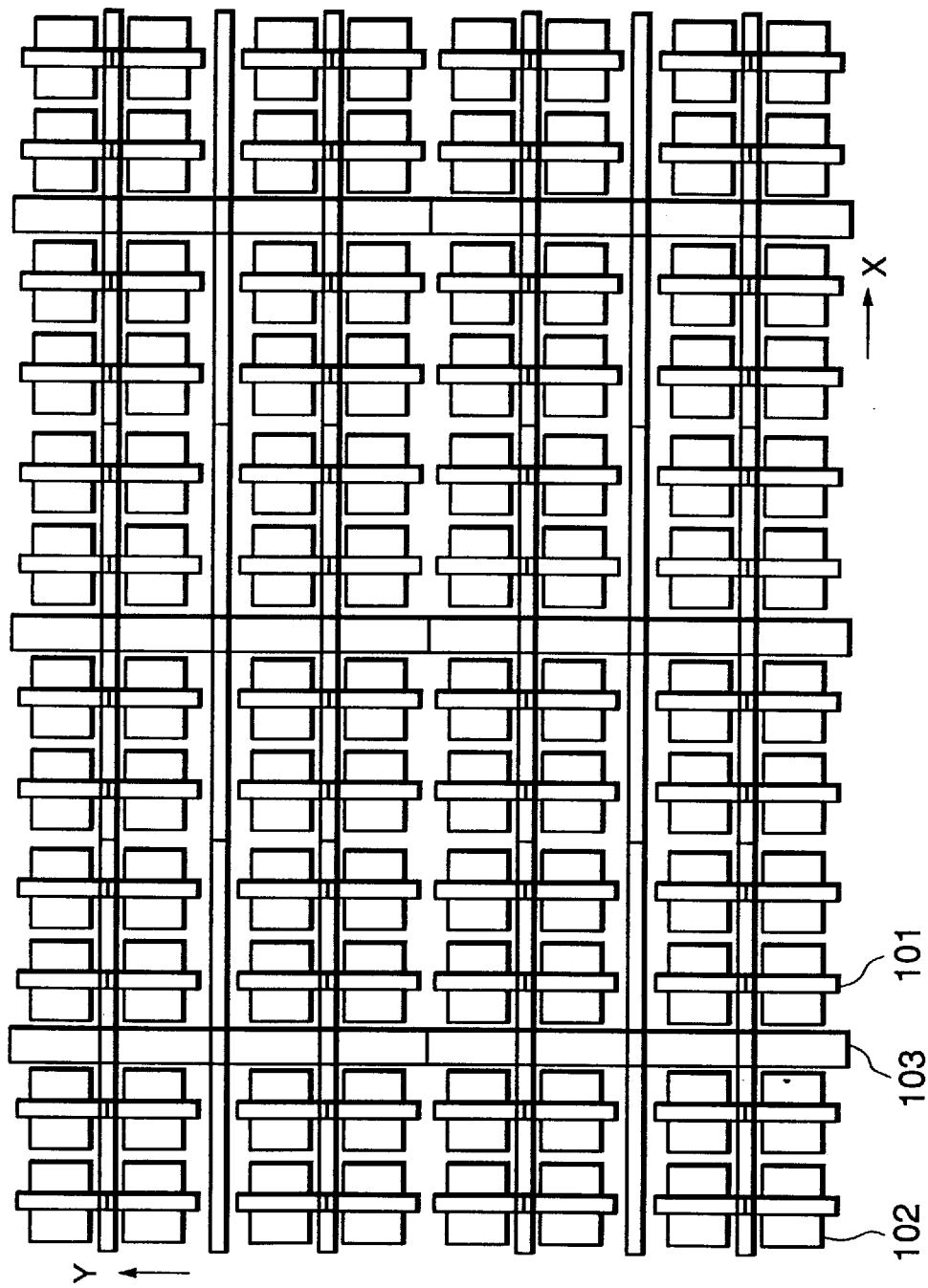
FIG. 10 is a view showing the layout of underlying cell figures by an array representation in the gate array LSI layout.
Figure 11:
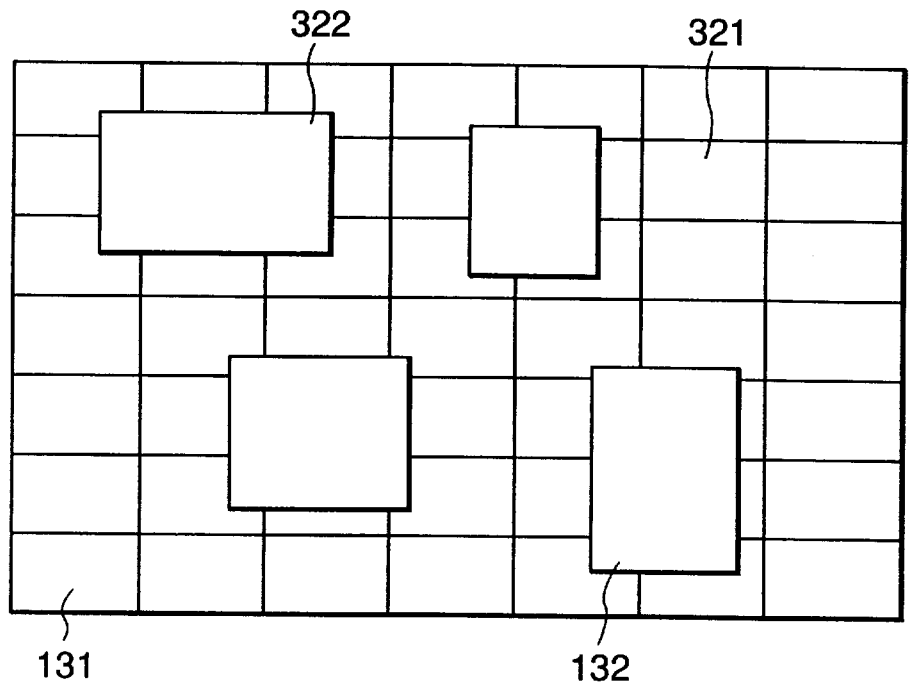
FIG. 11 is a view showing the state wherein function block cells are laid out overlapping underlying cells by the array representation in the gate array LSI layout in FIG. 10.
Figure 12:
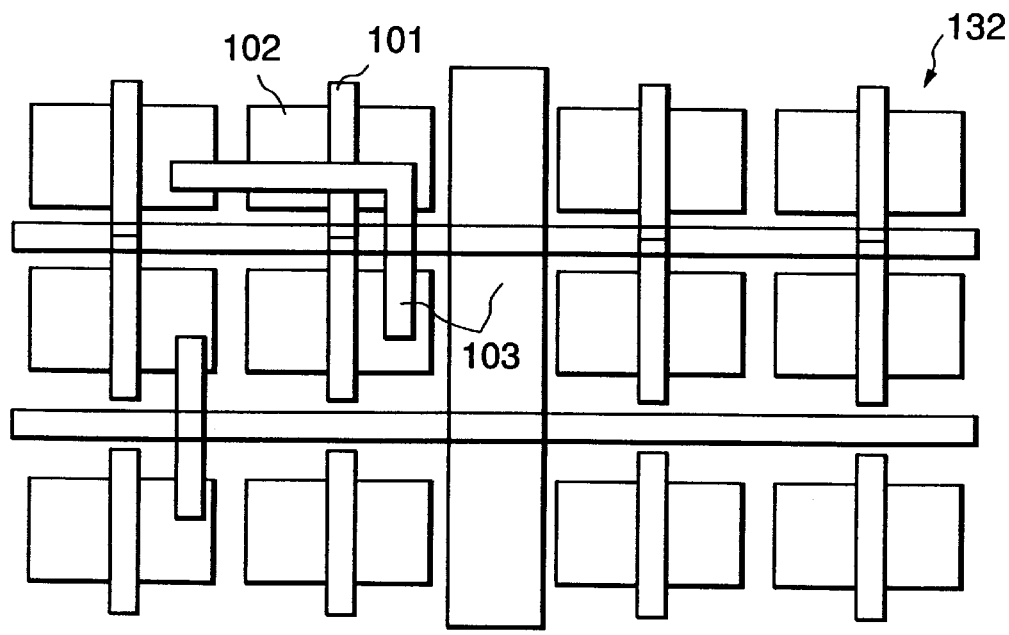
FIG. 12 is a view showing an example of the figure contents of the function block cell in FIG. 11.
Figure 13:
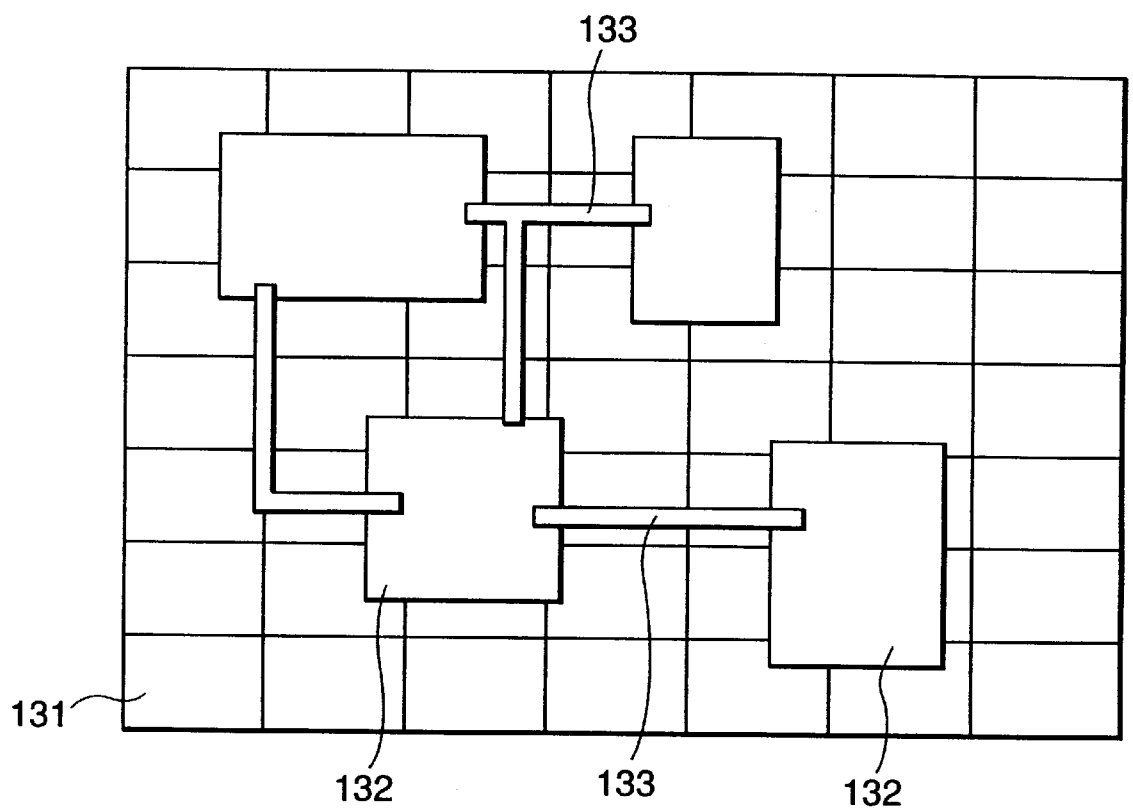
FIG. 13 is a view showing an example of the connection between cells by the function block cell layout in FIG. 11.
Figure 14:
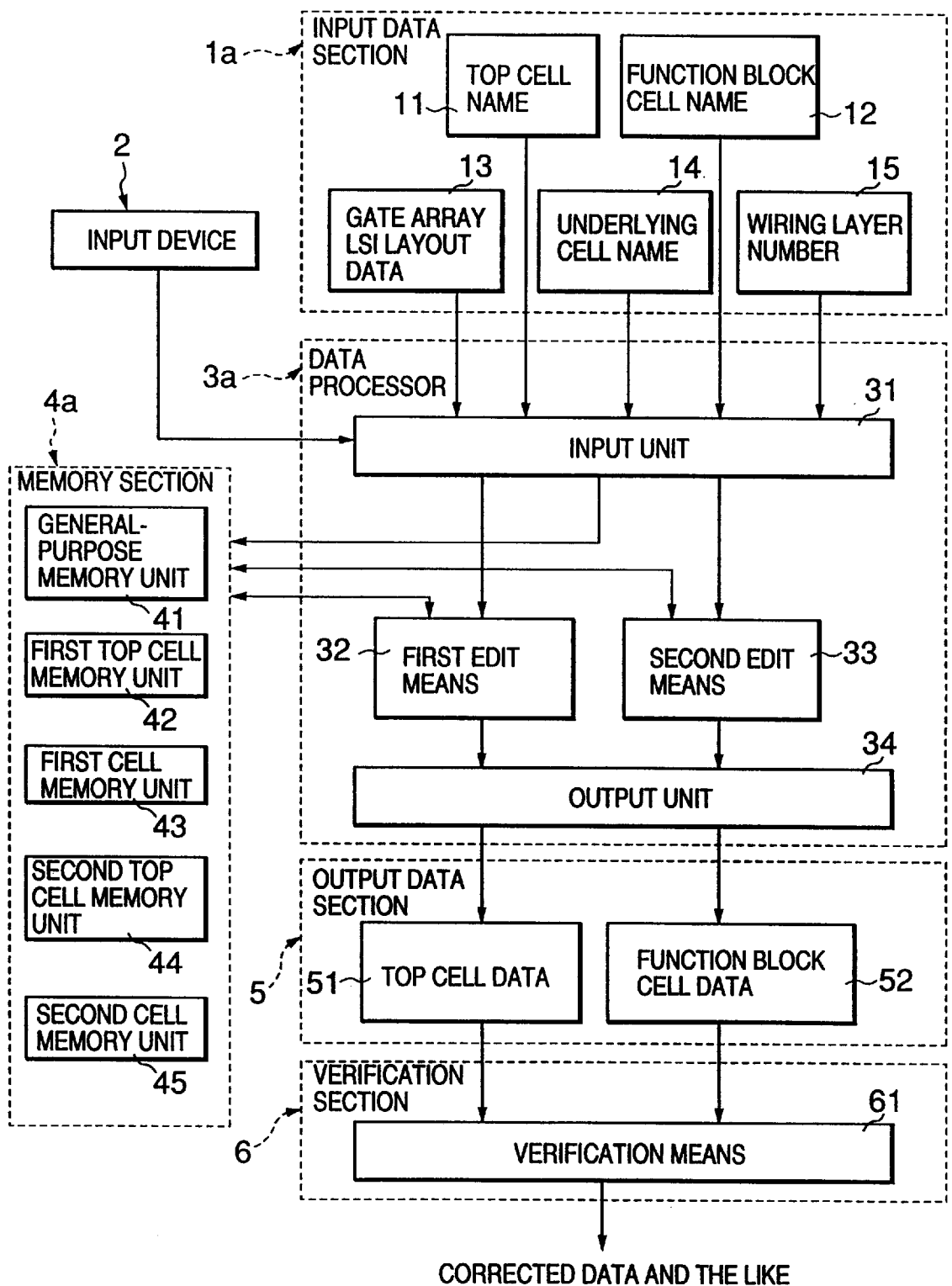
FIG. 14 is a block diagram showing the schematic arrangement of a cell hierarchy verification apparatus according to an embodiment of the present invention.
Figure 15A:
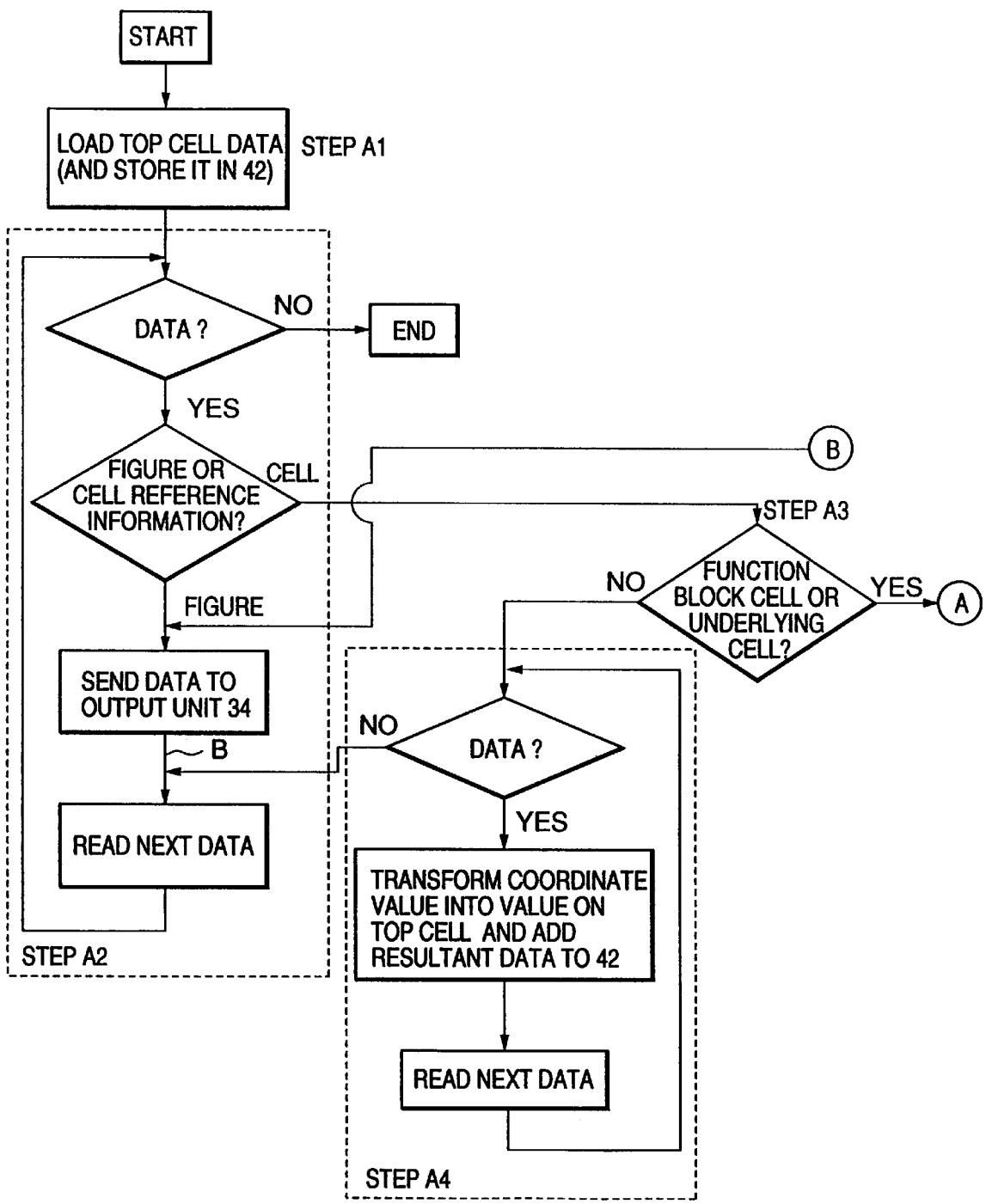
FIGS. 15A and 15B are flow charts showing the first mapping for gate array LSI layout data in the cell hierarchy verification apparatus in FIG. 14.
Figure 15B:
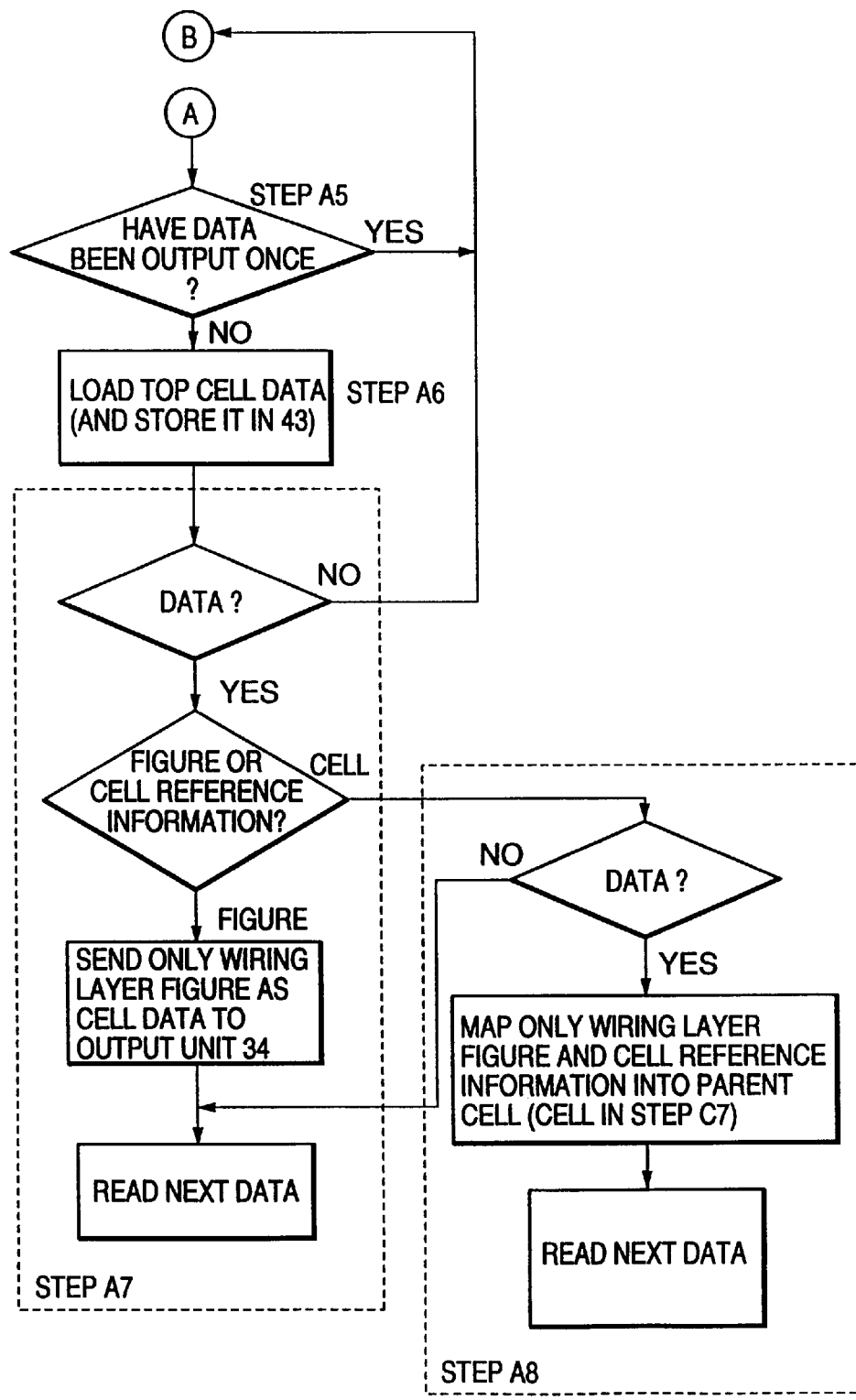

FIG. 14 is a block diagram showing the schematic arrangement of a cell hierarchy verification apparatus for an LSI layout according to an embodiment of the present invention. In FIG. 14, similar to the conventional apparatus described above, the cell hierarchy verification apparatus according to this embodiment comprises an input data section 1 having each input data registered in advance in a memory unit such as a hard disk, an input device 2 such as a keyboard or a mouse for instructing apparatus operation, a data processor 3 which operates under program control, a memory section 4 such as a memory on a computer, and an output data section 5 for outputting verification data to a memory unit such as a hard disk.

In this embodiment, the input data section 1 includes a top cell name 11, a function block cell name 12, LSI layout data 13, an underlying cell name 14, and a wiring layer number 15.

The data processor 3 comprises an input unit 31 for loading necessary data from the input data section 1 in correspondence with an operation instruction from the input device 2, a first edit means (first mapping means) 32 (to be described in detail later), a second edit means (second mapping means) 33, and an output unit 34 for outputting mapping results.

The memory section 4 comprises a general-purpose memory unit 41 for temporarily storing each data loaded by the input unit 31, a first top cell memory unit 42 and a first cell memory unit 43 which are used for cell mapping in correspondence with the first edit means 32, and a second top cell memory unit 44 and a second cell memory unit 45 which are used for cell mapping in correspondence with the second edit means 33.

The output data section 5 includes top cell data 51 and function block cell data 52 as LSI layout verification data 53 output upon mapping. A verification section 6 comprises an appropriate verification means 61 for verifying hierarchy on the basis of the top cell data 51 and the function block cell data 52, and outputs corrected verification result data and the like.

The operation of this embodiment will be described.

The input unit 31 of the data processor 3 instructed to read corresponding data in the input data section 1 from the input device 2 temporarily stores loaded gate array LSI layout data in the general-purpose memory unit 41 of the memory section 4. The stored data are mapped separately by the first and second edit means 32 and 33 of the data processor 3 as follows.

Mapping by the first edit means 32 will be described. FIGS. 15A, 15B, 16A, and 16B are flow charts showing mapping by the first edit means 32.

In the first edit means 32 according to the operation flow of FIGS. 15A, 15B, 16A, and 16B, in step A1, only top cell name data are loaded via the input unit 31 in accordance with data names stored in the general-purpose memory unit 41, and temporarily stored in the first top cell memory unit 42.

In step A2, data stored in the first top cell memory unit 42 are sequentially read out from the first one. Then, processing of "if the readout data is figure data, sending the readout data as top cell data to the output unit 34, erasing it from the first top cell memory unit 42, and reading out the next data" is repeatedly performed until all the stored data are processed.

If the readout data is cell reference information in step A2, it is checked in step A3 whether the cell name is a function block cell name or an underlying cell name stored in the general-purpose memory unit 41.

If NO in step A3, corresponding data is loaded via the input unit 31 in step A4. The coordinate values of the data are transformed into coordinates on the top cell, and the resultant data is additionally stored at the final address in the first top cell memory unit 42.

Figure 16A:
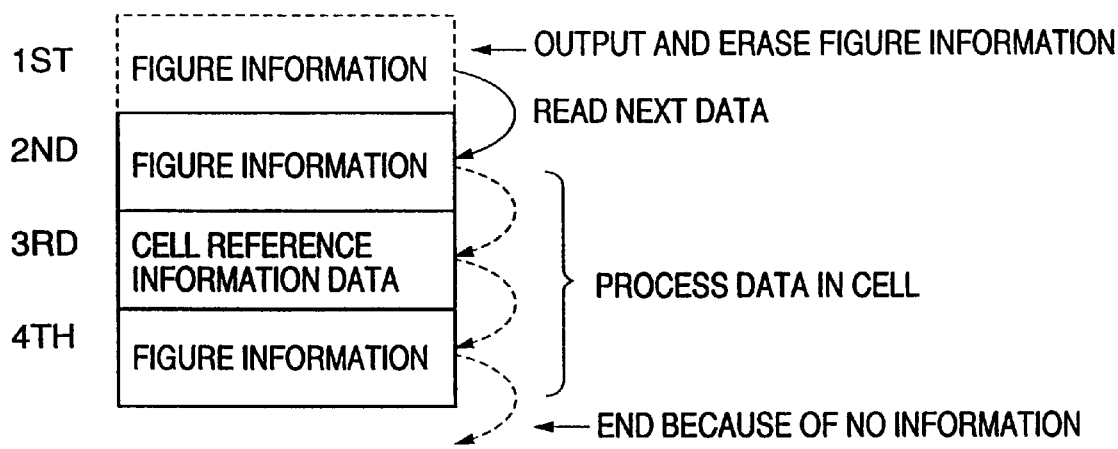
FIG. 16A is a view for explaining processing for gate array LSI layout data in the first top cell memory unit in FIG. 14.

FIG. 16A shows how to use the first top cell memory unit 42 in steps A2 and A4.

If YES in step A3, whether the cell has been mapped is checked in step A5. If NO in step A5, the cell data is stored in the first cell memory unit 43 in step A6.

In step A7, data stored in the first cell memory unit 43 are sequentially read out from the first one. Processing of "if the readout data is figure data, sending the readout data as cell data to the output unit 34, erasing it from the first cell memory unit 43, and reading out the next data" is repeatedly performed until all the stored data are processed.

If the readout data is cell reference information in step A7, the cell data is loaded via the input unit 31. If the loaded cell data is a wiring figure or cell reference information, its coordinates are transformed into values on the cell in step A7, and the resultant data is additionally stored as the cell data at the final address in the first cell memory unit 43 (step A8).

If YES in A5 or step A7 is complete, the flow returns again to step A2, and cell reference information is sent to the output unit 34.

Figure 16B:
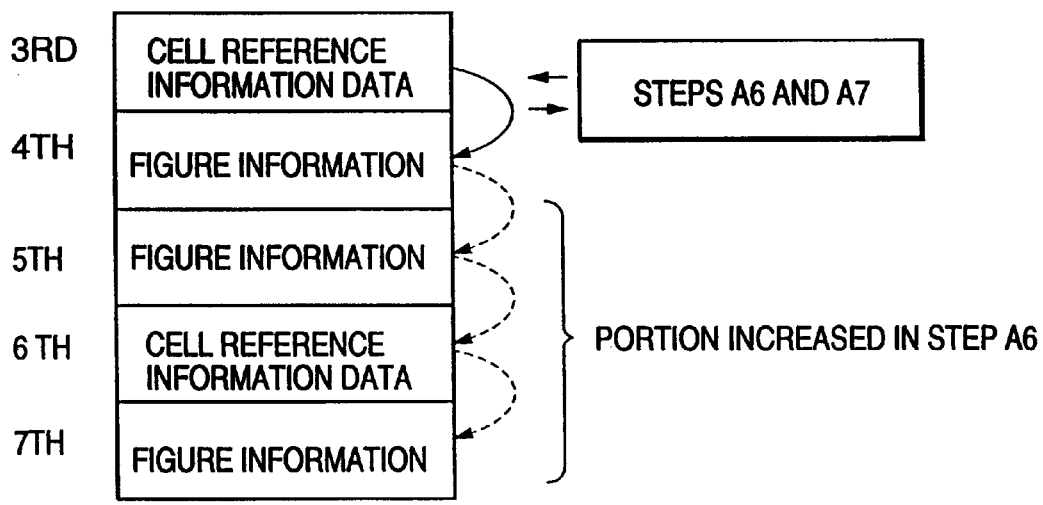
FIG. 16B is a view showing the state wherein child cell data is added in the first top cell memory unit in FIG. 14.

As shown in FIG. 16A, the whole operation flow in the first edit means 32 ends when all the top cell data stored in the first top cell memory unit 42 are sent to the output unit 34. In this case, however, as shown in FIG. 16B, child cell data mapped in step A4 is added in the first top cell memory unit 42. In addition data of a reference cell within the child cell, i.e., a grandchild cell for the top cell is newly added as child cell data at the final address in the first top cell memory unit 42. Until all child cells below the top cell are mapped, processing in step A2 is continuously performed.

If the mapped cell is a function block cell or a:n underlying cell, only wiring figures are output out of the figures of lower cells. For this purpose, steps A5 to A8 are added.

Figure 17:
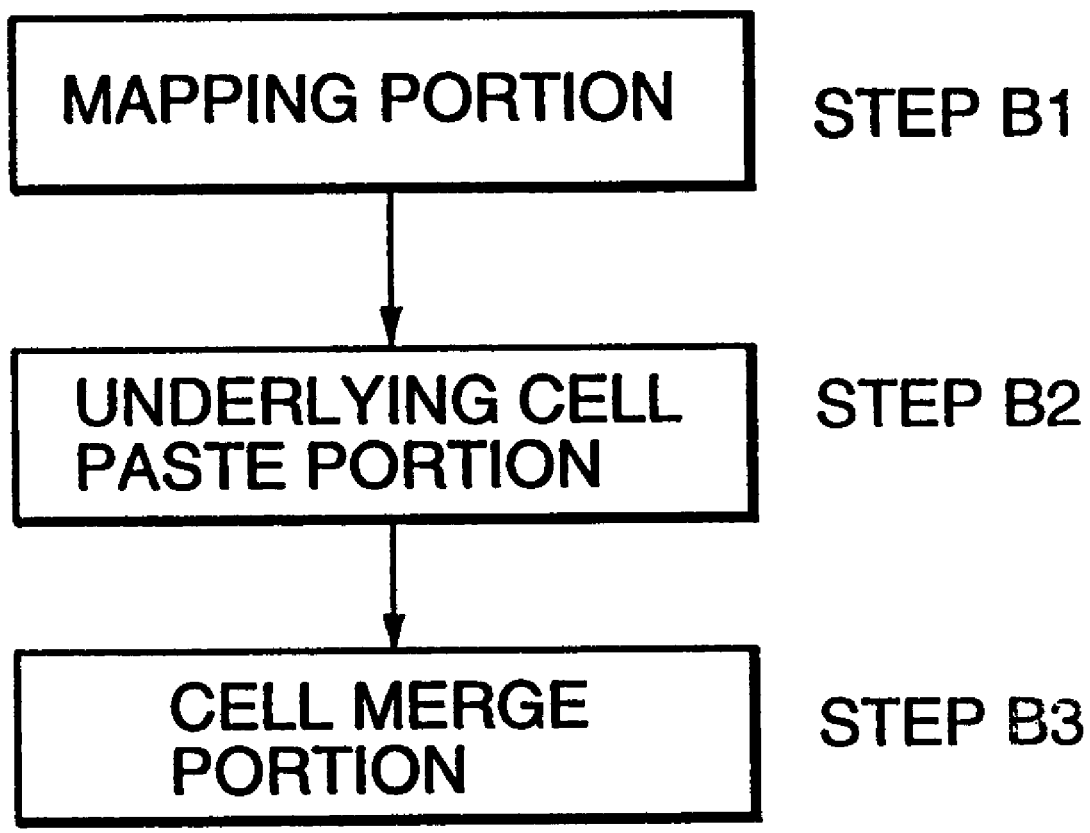
FIG. 17 is a flow chart showing the second mapping for gate array LSI layout data in the cell hierarchy verification apparatus in FIG. 14.
Figure 18A:
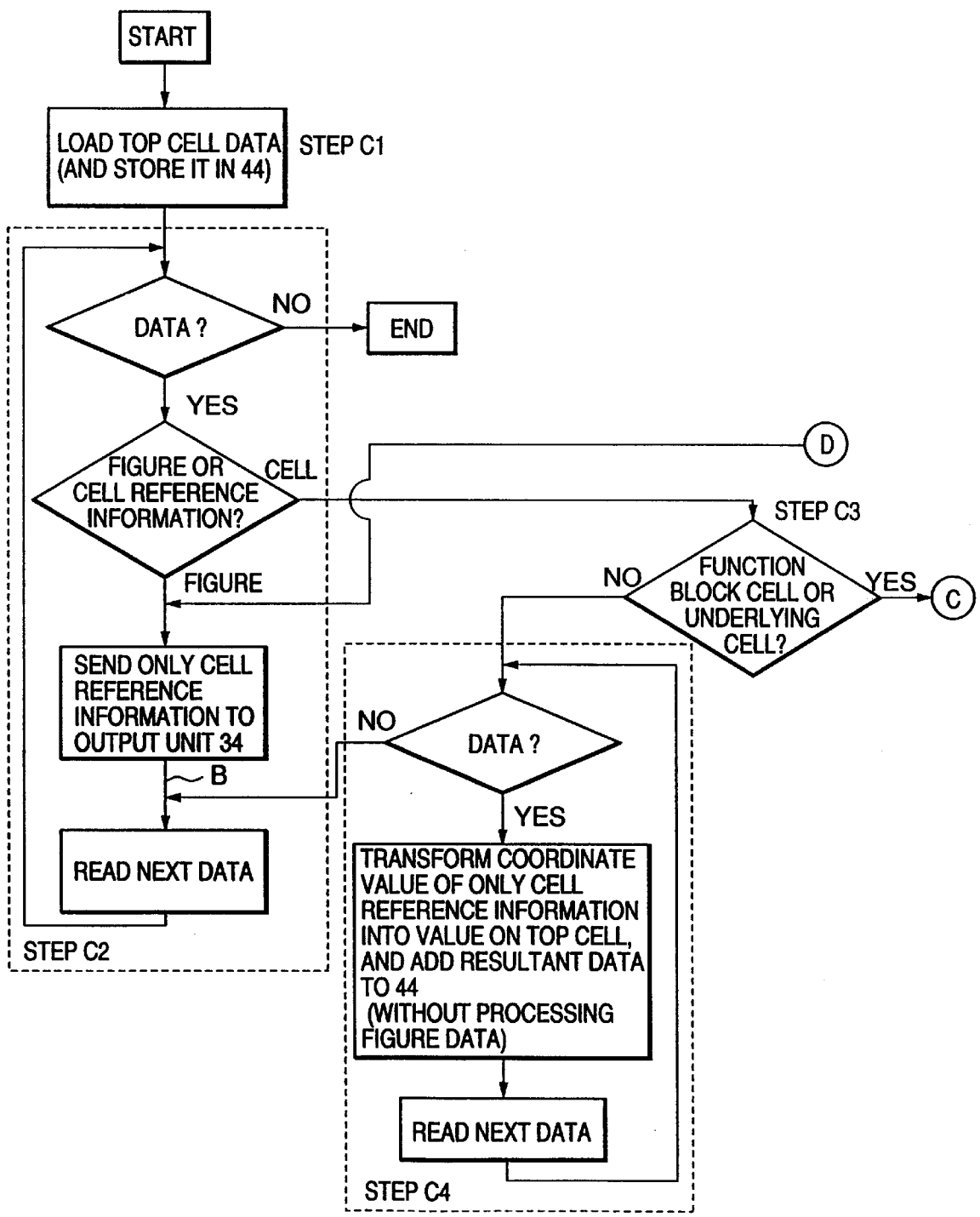
FIGS. 18A and 18B are flow charts showing the second mapping for gate array LSI layout data in the cell hierarchy verification apparatus in FIG. 14.
Figure 18B:
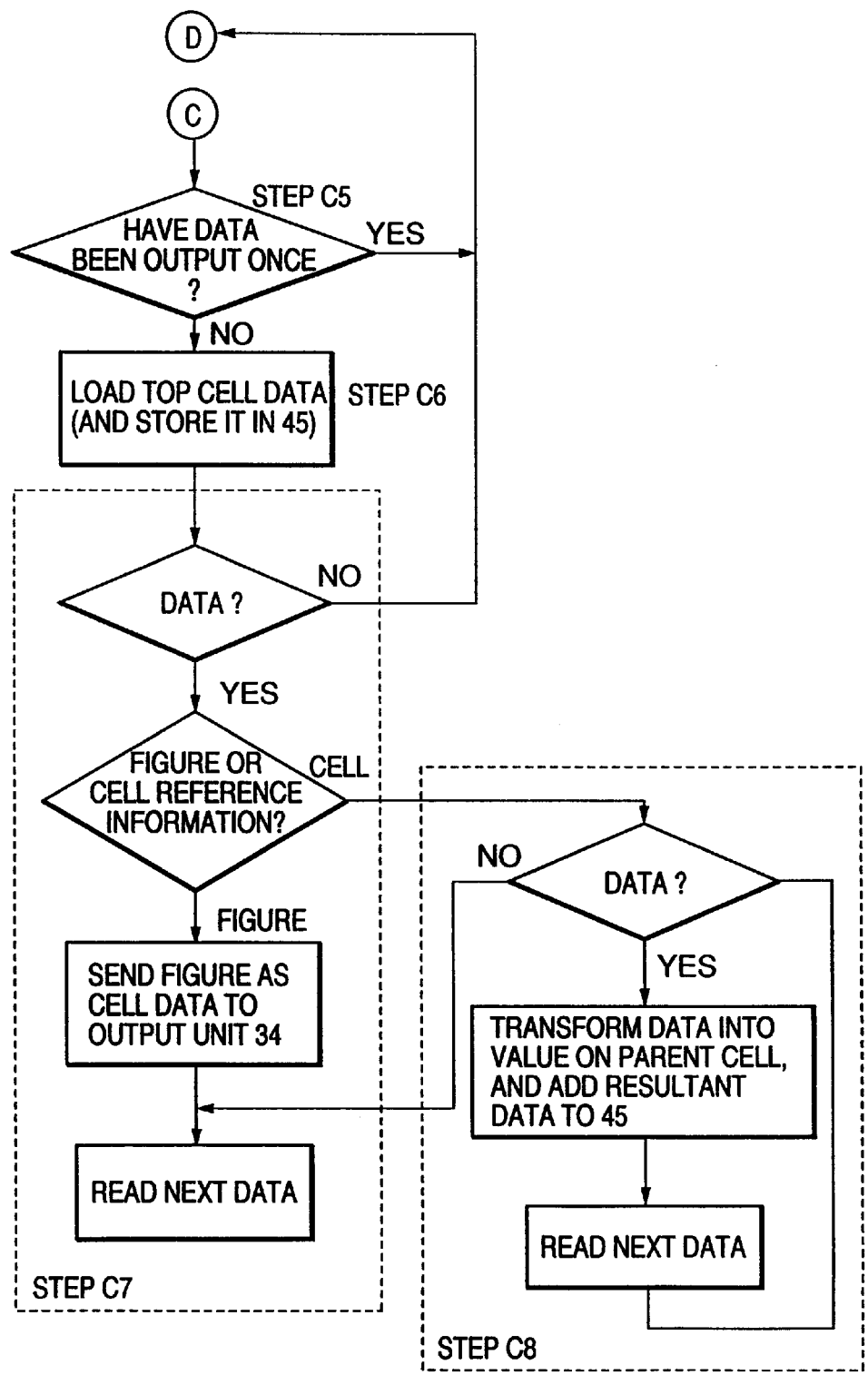

Mapping by the second edit means 33 will be described. FIG. 17 is a block diagram for explaining mapping by the second edit means 33. FIGS. 18A and 18B are operation flow charts showing the mapping.

Referring to FIG. 17, the second edit means 33 maps a cell in step B1, pastes an underlying cell on a function block cell in step B2, and merges cells in step B3.

More specifically, in the second edit means 33 according to the operation flow of FIGS. 18A and 18B, in step C1, only top cell name data are loaded via the input unit 31 in accordance with data names stored in the general-purpose memory unit 41, and stored in the second top cell memory unit 44.

In step C2, data stored in the second top cell memory unit 44 are sequentially read out from the first one. Processing of "if the readout data is figure data, erasing it from the second top cell memory unit 44 without any processing, and reading out the next data" is repeatedly performed until all the stored data are processed.

If the readout data is cell reference information in step C2, it is checked in step C3 whether the cell name is a function block cell name or an underlying cell name stored in the general-purpose memory unit 41.

If NO in step C3, corresponding data is loaded via the input unit 31 in step C4. If the data is figure data, it is left unchanged. If the data is cell reference data, its coordinate values are transformed into values on the cell in step C2, and the resultant data is additionally stored as cell data at the final address in the second top cell memory unit 44.

If the cell reference data is determined to be a function block cell name or an underlying cell name, whether the cell has been mapped is checked in step C5, and then the cell data is stored in the second cell memory unit 45.

In step C6, data stored in the second top cell memory unit 44 are sequentially read out from the first one. Processing of "if the readout data is figure data, sending the readout data as cell data to the output unit 34, erasing it from the second cell memory unit 45, and reading out the next data" is repeatedly performed until all the stored data are processed.

If the readout data is cell reference information in step C7, corresponding cell data is loaded via the input unit 31, its coordinate values are transformed into values on the cell in step C7, and the resultant data is additionally stored as cell data at the last address in the second cell memory unit 45 (step C8).

The whole operation flow in the second edit means 33 ends when all top cell data stored in the second top cell memory unit 44 are mapped in step C2. Also in this case, data of a grandchild cell for the top cell is additionally stored as reference data for the child cell at the final address in the second top cell memory unit 44 in step C4. Until the contents of all child cells below the top cell are retrieved, processing in step C2 is continuously performed. In step C2, however, only when the mapped cell is a function block cell or an underlying cell, the flow progresses to step C6 to leave the reference data. Data of cells below the mapped cell are sent as top cell data 51 to the output unit 34.

Figure 19:
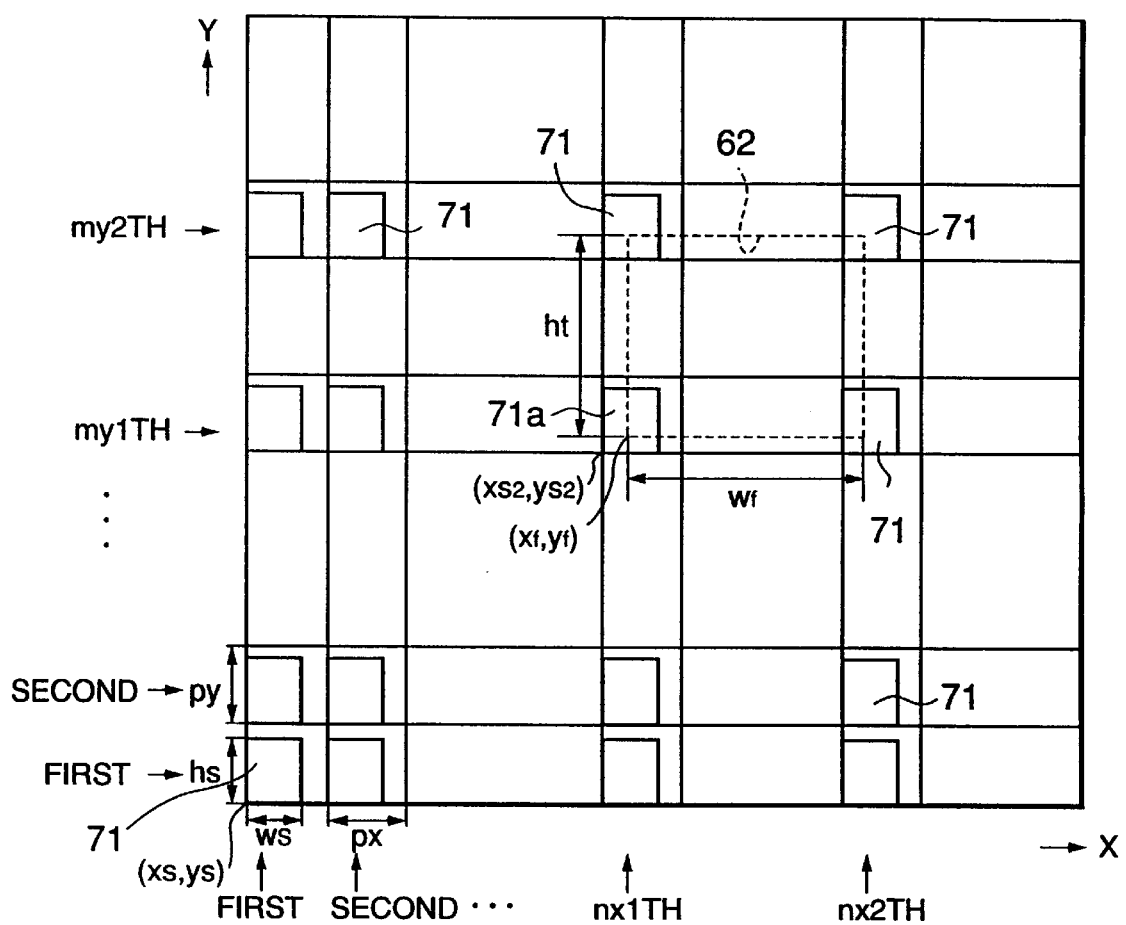
FIG. 19 is a view showing an underlying cell paste portion processed by the second mapping in FIG. 17.
Figure 20:
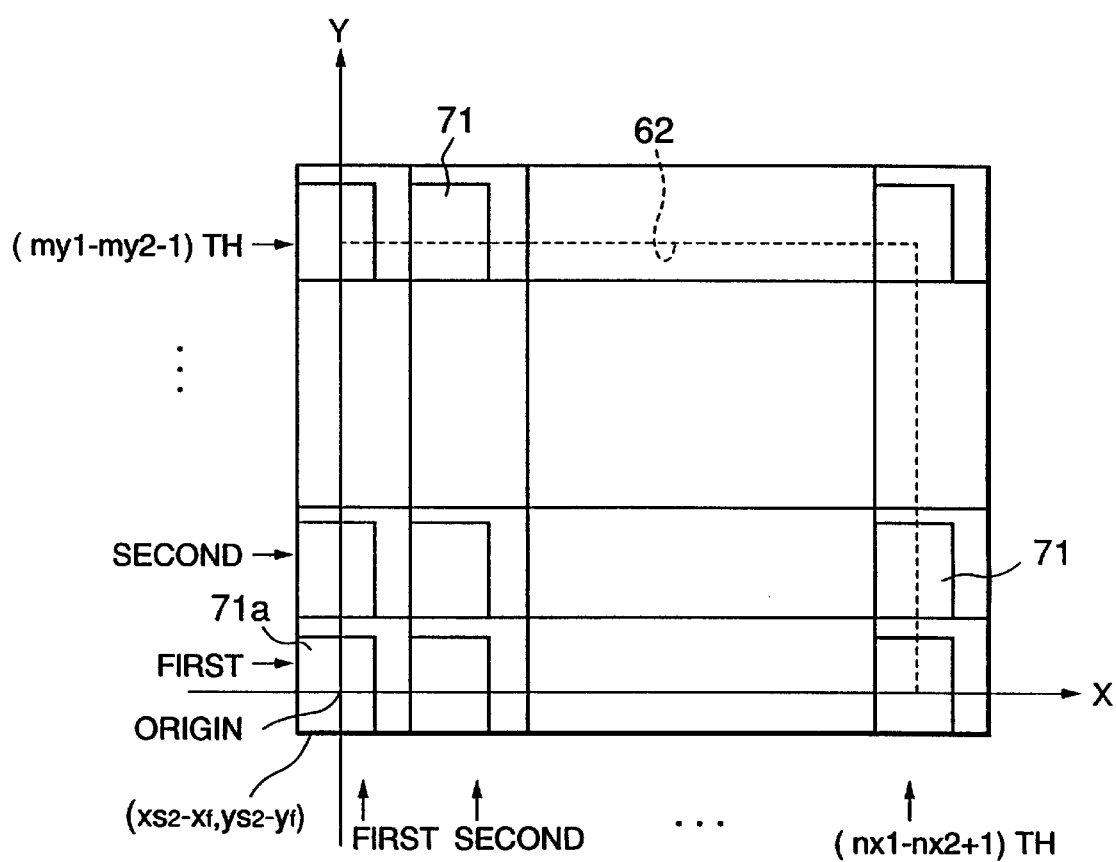
FIG. 20 is a view for explaining a method of calculating a paste underlying cell in pasting the underlying cell in the second mapping in FIG. 17.

In mapping by the second edit means 33 shown in FIGS. 17, 18A, and 18B, the role of step B2 for each function block cell whose data is mapped in step B1 in FIG. 17 will be explained in detail. FIGS. 19 and 20 are explanatory views showing the concept of the mapping method. FIG. 19 is a view for explaining an underlying cell paste portion in FIG. 17. FIG. 20 is a view for explaining calculation of a paste underlying cell in pasting the underlying cell.

Referring to FIG. 19, the gate array LSI layout is constituted by underlying cells 71 $w_s$ in width and $h_s$ in height, and function block cells 72 $w_f$ in width and $h_f$ in height.

Coordinates $(x_s, y_s)$ on the top cell reference n x m underlying cells 71, i.e., n underlying cells 71 at an interval $p_x$ in the positive direction along the x axis, and m underlying cells 71 at an interval $p_y$ in the positive direction along the y axis. Coordinates $(x_f, y_f)$ on the top cell reference the function block cell 72. In FIGS. 19 and 20, reference numeral 71a denotes an underlying cell serving as a paste reference for the function block cell 72 by calculation within the cell synthesis portion of the function block.

At the cell synthesis portion, in order to calculate the minimum number of underlying cells 71 on which the function block cell 72 is placed, of the underlying cells 71 laid out by an array representation, ones overlapping the function block cell 72 in the x- and y-axis directions are obtained by relations (1) and (2) below.

That is, overlapping underlying cells 71 in the x-axis direction are obtained by calculating $n=n_{x1}$ satisfying $$x_s + p_x(n-1) \leq x_f, x_f < x_s + p_x n \tag{1}$$

and $n=n_{x2}$ satisfying $$x_s + p_x(n-1) \leq x_f + w_f, x_f + w_f < x_s + p_x n \tag{2}$$

Consequently, $n_{x1}$ to $n_{x2}$ underlying cells 71 in the x-axis direction are found to overlap the cell area of the function block cell 72.

Also, overlapping underlying cells 71 in the y-axis direction are obtained by calculating values $m_{y1}$ and $m_{y2}$ by the same method.

The lower left coordinates $(x_{s2}, y_{s2})$ of the underlying cell 71a are calculated by:

$$x_{s2} = x_s + p_x(n_{x1}-1), y_{s2} = y_s + (n_{y1}-1) \tag{3}$$

In this way, a new top cell is created and its origin references the function block. That is, as shown in FIG. 20, the coordinates of the cell 71a serving as an origin for underlying cells on the newly created top cell are set to $$x = x_{s2} - x_f, y = y_{s2} - y_f$$

so as to maintain the relative positional relationship between the function block cell 72 and the underlying cell 71a. This position references $(n_{x2}-n_{x1}+1) \times (n_{y2}-n_{y1}+1)$ underlying cells 71 in the positive directions along the x and y axes. The obtained cell data is output to a cell merge portion (step B3) in FIG. 17.

Figure 21:
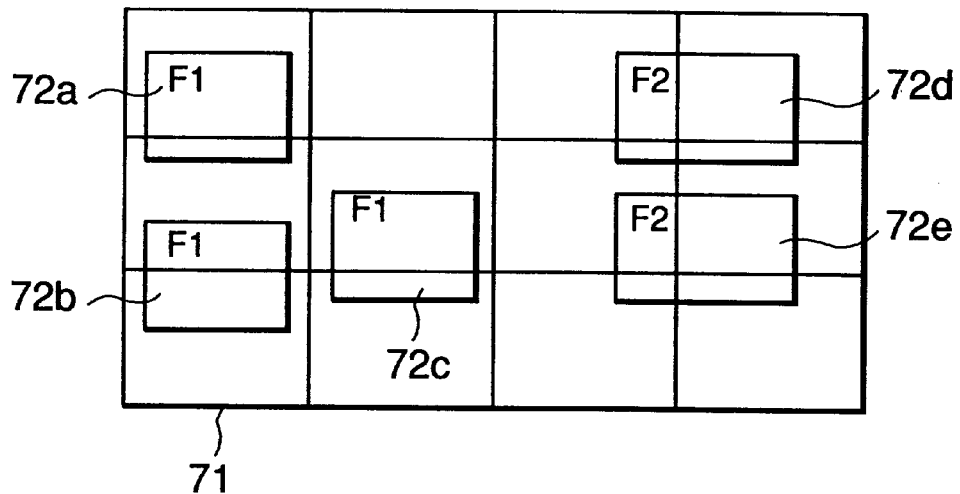
FIG. 21 is a view showing the state wherein underlying cells are actually pasted on the underlying cell paste portion in FIG. 20.

Processing at the cell merge portion will be described. FIG. 21 and FIGS. 22A to 22E are explanatory views each showing the form of the cell merge portion. FIG. 21 is a view showing the state wherein underlying cells are actually pasted on the underlying cell paste portion. FIGS. 22A to 22E are views for explaining a pattern at each cell merge portion on the underlying cell layout.

Generally, the gate array LSI layout data 13 references a plurality of identical function block cells. In this case, the positional relationship between function block cells and underlying cells may be different or the same for each referenced portion. As for function block cells having the same relative positional relationship with underlying cells within the same function block cell name, they are output as identical cells at the underlying cell paste portion. Therefore, these repetitive, wasteful function block cells are merged into one, and the merged cell is sent to the output unit 34.

More specifically, referring to FIG. 21, the gate array LSI layout data is made up of function block cells 72a, 72b, and 72c each having cell name F1, function block cells 72d and 72e each having cell name F2, and underlying cells 71.

Figure 22A:
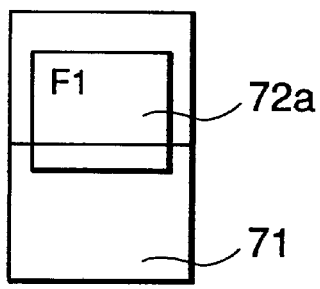
FIGS. 22A to 22E are views each showing a pattern at a cell merge portion on the underlying cell layout in FIG. 21.
Figure 22B:
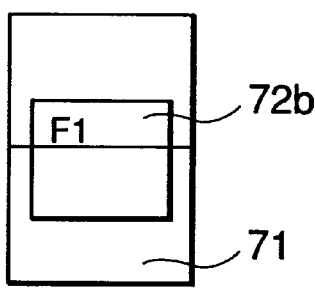
Figure 22C:
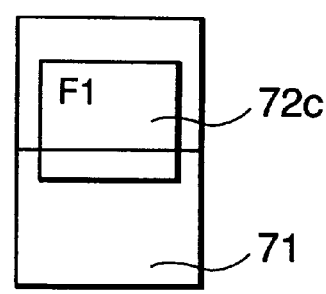
Figure 22D:
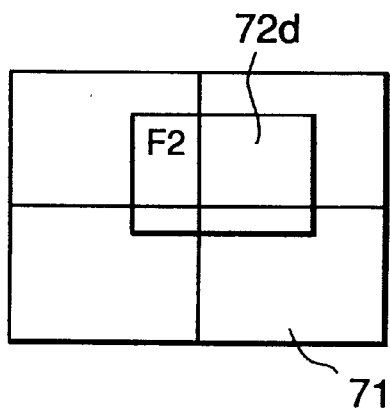
Figure 22E:
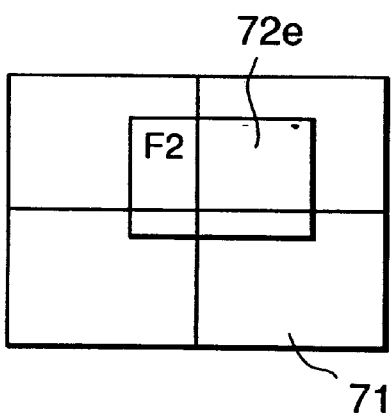

The patterns shown in FIGS. 22A to 22E correspond to cell data output in step B2 that are prepared by pasting the underlying cells 71 on the function block cells 72a to 72e. In this case, the function block cells 72a (FIG. 22A) and 72c (FIG. 22C) formed in the same pattern, and the function block cell 72d (FIG. 22D) and 72e (FIG. 22E) formed in the same pattern are respectively merged because of the same relative positional relationships. As a result, in step B2, data of the function block cells 72a, 72b, and 72d corresponding to FIGS. 22A, 22B, and 22D are output as function block cell data 52 to the output unit 34.

The output unit 34 stores each received data, i.e., each top cell data 51 mapped by the first edit means 32 and each function block cell data 52 mapped by the first edit means 32 in a memory unit such as a hard disk. The stored data 51 and 52 are sent to the verification section 6, which verifies the hierarchy of the gate array LSI layout.

Figure 23A:
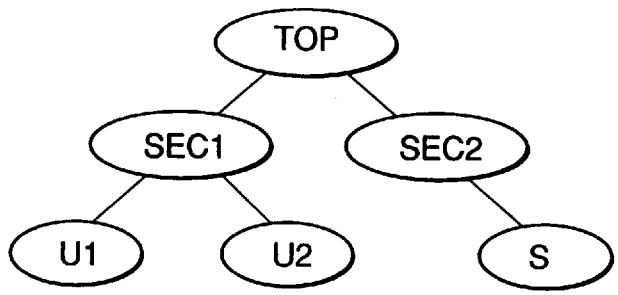
FIG. 23A is a view for explaining the hierarchical structure of input gate array LSI layout data for the cell hierarchy verification apparatus in FIG. 14.
Figure 23B:
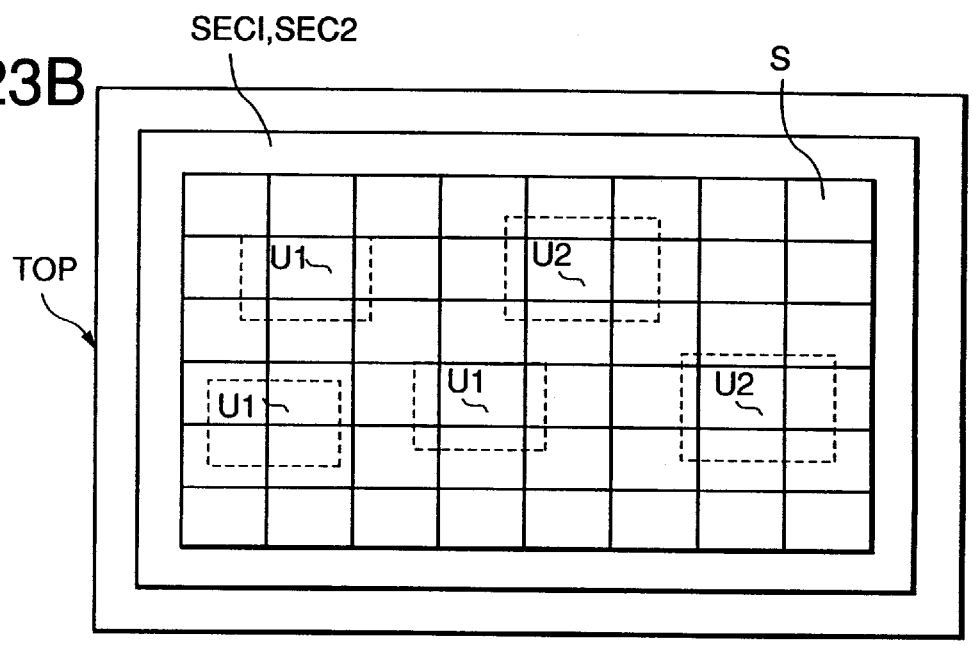
FIG. 23B is a view showing the hierarchical structure of all lower cells below the top cell.
Figure 23C:
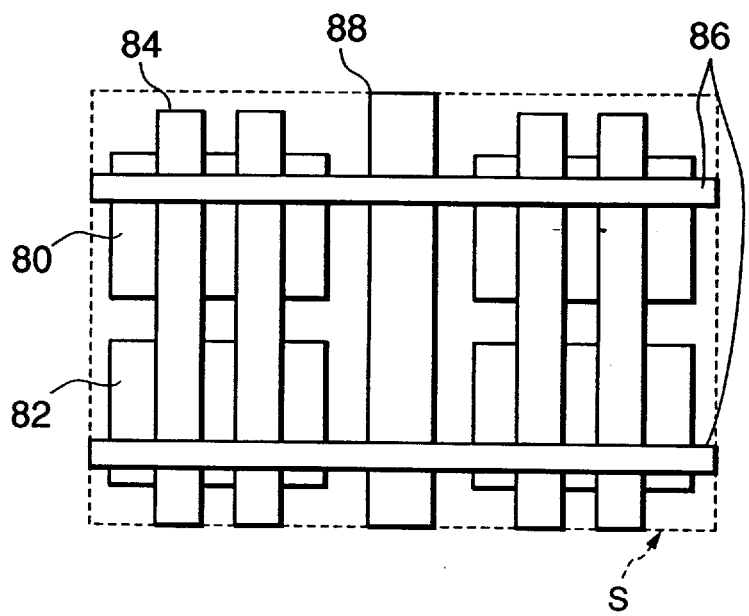
FIG. 23C is a view showing an example of the schematic layout of one cell in FIG. 23B.

Mapping upon reception of actual data will be exemplified. FIGS. 23A to 23C are explanatory views of input data FIG. 23A shows the cell hierarchy of input data. In this case, the top cell has name [TOP]. Top cell [TOP] references cells [SEC1] and [SEC2]. Cell [SEC1] references overlying cells [U1] and [U2]. Cell [SEC2] references underlying cell [S].

FIG. 23B is a schematic view showing the hierarchy state of all lower cells below top cell [TOP], i.e., the overlapping state.

FIG. 23C is a view showing an example of the schematic layout of the underlying cell [S]. In this example, cell [S] includes figure data of wiring layers 86 and 88, diffusion layers 80 and 82, and a polysilicon layer 84. Overlying cells [U1] and [U2] are constructed by data of only wiring layers.

When the data in FIG. 21 are input, the input data nare D1, the top cell name TOP, the function block cell names U1 and U2, the underlying cell name S, and the wiring layer numbers 86 and 88 are input from the input device 2. These data are temporarily stored in the general-purpose memory unit 41 of the memory section 4.

Figure 24A:
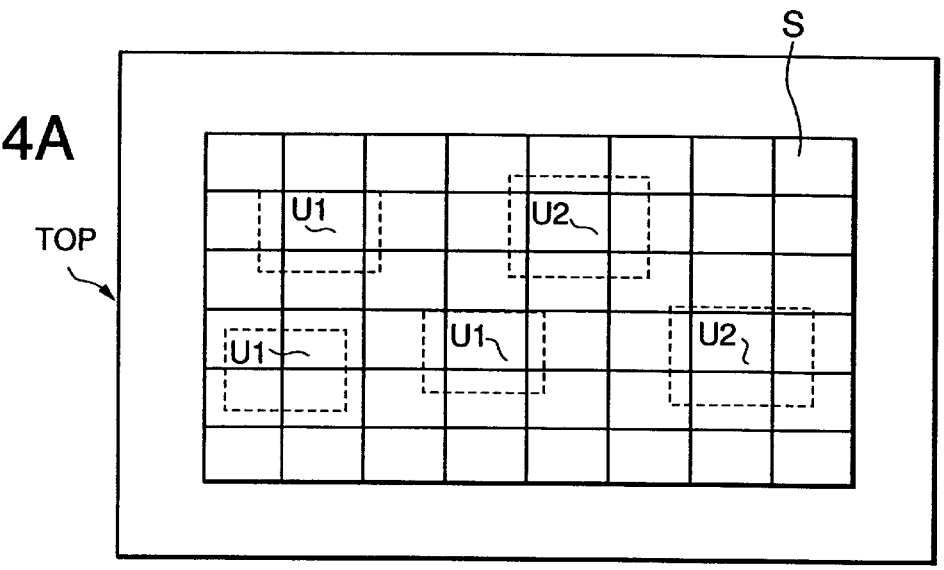
FIGS. 24A and 24B are views each showing the state of figure data mapped and output by the first edit means in correspondence with input data.
Figure 24B:
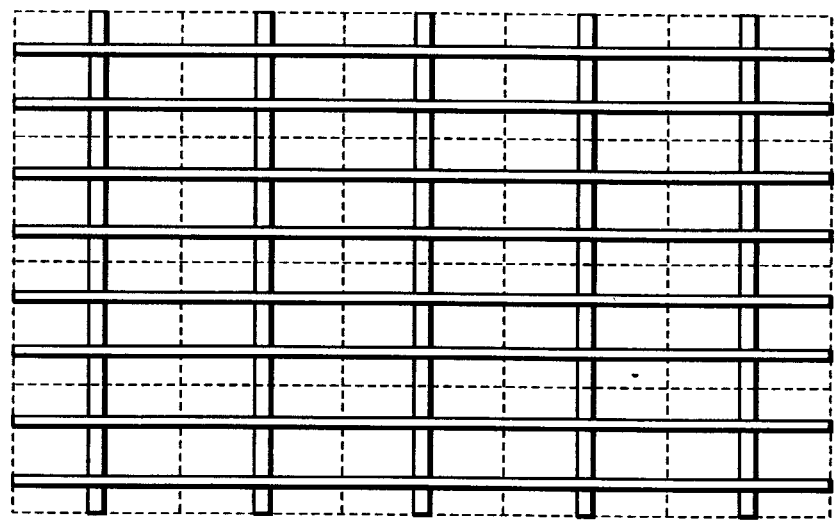

In the first edit means 32, cells SEC1 and SEC2 are mapped and vanish by the mapping unit. Then, top cell TOP directly references cells U1 and U2 below cell SEC1, and cell S below cell SEC2. FIG. 24A shows this state. At this time, only the wiring of the underlying cell S is left and referenced. FIG. 24B shows this state.

Figure 25A:
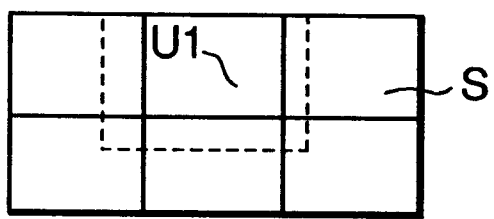
FIGS. 25A to 25C are views each showing the state of figure data mapped and output by the second edit means in correspondence with input data.
Figure 25B:
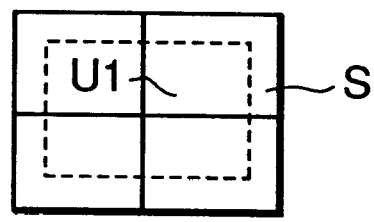
Figure 25C:
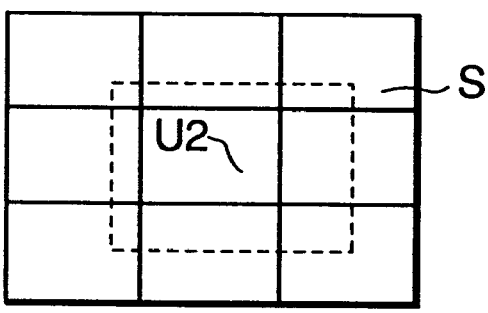

In this second edit means 33, the figure of top cell TOP is erased by the mapping unit, while cells U1, U2 and S below cells SEC1 and SEC2 are mapped into top cell TOP. Consequently, minimum underlying cells including cells U1 and U2 are pasted, and the resultant data is stored in a memory unit by the output unit 34. FIGS. 25A to 25C show the state of each figure data processed by the second edit means 33.

In this manner, the cell hierarchy in the gate array LSI layout is verified.

What is claimed is:

1. A cell hierarchy verification method for an LSI layout with input figure data forming a gate array LSI layout and cell hierarchy of the LSI layout verified using output data of a mapping result, comprising:

mapping a top cell from a top cell data portion of said input figure data while leaving only a wiring figure in an underlying cell;

outputting top cell data;

mapping an underlying cell from a data portion for mapping a function block cell of each input figure data;

pasting said mapped underlying cell while maintaining a relative positional relationship with a laid function block cell;

outputting function block cell data including said pasted mapped underlying cell; and verifying the cell hierarchy using the output data.

2. A method according to claim 1, wherein a top cell data portion of each input figure data and a function block cell data portion of each input figure data are separately mapped by first mapping means and second mapping means.

3. A method according to claim 1, wherein each input figure data includes gate array LSI layout data, a wiring layer number, an underlying cell name, and an overlying cell name, and a top cell data portion and a function block cell data portion of the figure data are mapped.

4. A cell hierarchy verification apparatus for an LSI layout with input and mapped figure data forming a gate array LSI layout and cell hierarchy of the LSI layout verified using output data of a mapping result, comprising:

first mapping means for mapping a top cell data portion of each input figure data while leaving only a wiring figure in an underlying cell, and outputting top cell data; and second mapping means for mapping an underlying cell of a function block cell data portion, pasting the mapped underlying cell while maintaining a relative positional relationship with a laid function block cell, and outputting function block cell data, wherein the cell hierarchy is verified using the output data.

5. An apparatus according to claim 4, wherein each input figure data includes gate array LSI layout data, a wiring layer number, an underlying cell name, and an overlying cell name, and a top cell data portion and a function block cell data portion of the figure data are separately mapped by said first mapping means and said second mapping means.

6. A cell hierarchy verification apparatus for an LSI layout with input and mapped figure data forming a gate array LSI layout and cell hierarchy of the LSI layout verified using output data of a mapping result, comprising:

a first editor mapping a top cell data portion of each input figure data while leaving only a wiring figure in an underlying cell, and outputting top cell data; and a second editor mapping an underlying cell of a function block cell data portion, pasting the mapped underlying cell while maintaining a relative positional relationship with a laid function block cell, and outputting function block cell data;

wherein the cell hierarchy is verified using the output data.

7. An apparatus according to claim 6, wherein each input figure data includes gate array LSI layout data, a wiring layer number, an underlying cell name, and an overlying cell name; and a top cell data portion and a function block cell data portion of the figure data are separately mapped by said first editor and said second editor.

* * * * *